United States Patent
Coelho et al.

(10) Patent No.: US 8,205,187 B1
(45) Date of Patent: Jun. 19, 2012

(54) GENERALIZING AND INFERRING BEHAVIORS OF A CIRCUIT DESIGN

(75) Inventors: Claudionor José Nunes Coelho, Minas Gerais (BR); Chung-Wah Norris Ip, Cupertino, CA (US); Harry David Foster, Plano, TX (US); Rajeev Kumar Ranjan, Sunnyvale, CA (US); Kathryn Drews Kranen, Menlo Park, CA (US); Georgia Penido Safe, Minas Gerais (BR)

(73) Assignee: Jasper Design Automation, Inc., Mountain View, CA (US)

( * ) Notice: Subject to any disclaimer, the term of this patent is extended or adjusted under 35 U.S.C. 154(b) by 70 days.

(21) Appl. No.: 12/797,473

(22) Filed: Jun. 9, 2010

Related U.S. Application Data (60) Provisional application No. 61/185,548, filed on Jun. 9, 2009.

(51) Int. Cl.
*G06F 17/50* (2006.01)
(52) U.S. Cl. ........ 716/139; 716/102; 716/106; 716/111; 716/136; 703/16
(58) Field of Classification Search .................. 716/102, 716/106, 111, 136, 139; 703/16
See application file for complete search history.

(56) References Cited

U.S. PATENT DOCUMENTS

| | | | | |
|---|---|---|---|---|
| 5,907,698 A * | 5/1999 | Kucukcakar et al. | ......... | 716/104 |
| 6,871,331 B1 * | 3/2005 | Bloom et al. | .................. | 716/102 |
| 7,031,899 B2 * | 4/2006 | Hsu et al. | ......................... | 703/15 |
| 7,079,997 B1 * | 7/2006 | Hsu et al. | ......................... | 703/14 |
| 7,137,078 B2 | 11/2006 | Singhal et al. | | |
| 7,346,861 B1 * | 3/2008 | Lee | ................. | 716/103 |
| 7,360,189 B1 * | 4/2008 | Molson | ......................... | 716/108 |
| 7,415,686 B2 * | 8/2008 | Andreev et al. | ................ | 716/113 |
| 7,418,678 B1 | 8/2008 | Ip et al. | | |
| 7,421,668 B1 | 9/2008 | Ip et al. | | |
| 7,437,694 B1 | 10/2008 | Loh et al. | | |
| 7,500,228 B2 * | 3/2009 | Holmes et al. | ................ | 717/136 |
| RE40,925 E * | 9/2009 | Ly et al. | ......................... | 716/103 |
| 7,603,636 B2 * | 10/2009 | Yamada | ......................... | 716/106 |
| 7,676,777 B2 * | 3/2010 | Kowatari et al. | .............. | 716/106 |
| 7,908,577 B2 * | 3/2011 | Tsuchiya | ......................... | 716/108 |
| 8,046,206 B1 * | 10/2011 | Hood et al. | ...................... | 703/13 |
| 8,108,194 B2 * | 1/2012 | Zhu et al. | ......................... | 703/14 |
| 2002/0147576 A1 * | 10/2002 | Hsu et al. | ......................... | 703/15 |
| 2003/0135834 A1 * | 7/2003 | Tojima et al. | .................... | 716/10 |
| 2004/0243374 A1 * | 12/2004 | Kundert | ......................... | 703/14 |
| 2005/0091025 A1 * | 4/2005 | Wilson et al. | .................... | 703/16 |
| 2007/0234249 A1 * | 10/2007 | Kowatari et al. | .................. | 716/5 |
| 2008/0059928 A1 * | 3/2008 | Takei et al. | ......................... | 716/5 |

(Continued)

FOREIGN PATENT DOCUMENTS

JP 2006244119 A * 9/2006

*Primary Examiner* — Phallaka Kik
(74) *Attorney, Agent, or Firm* — Fenwick & West LLP (57) ABSTRACT

An executable circuit design is used to generate waveforms, from which behaviors of the circuit are captured. The behaviors and various combinations thereof can then be saved in a database, along with descriptions and other metadata about them, thereby generating a behavioral index of the circuit design code. Behavioral indexing of circuit designs allows a user to maintain an indexed behavior database, track changes in behaviors as the circuit design's executable description evolves, and figure out how the executable description can be reused in different projects. When applied to digital design development, it facilities the current design and verification effort, as well as design reuse down the line.

20 Claims, 10 Drawing Sheets

U.S. PATENT DOCUMENTS

2008/0104556 A1* 5/2008 Yamada ............................ 716/5
2009/0064059 A1* 3/2009 Tsuchiya ........................... 716/1
2009/0193373 A1* 7/2009 Abbaspour et al. ................ 716/6
2009/0271167 A1* 10/2009 Zhu et al. ......................... 703/14
2010/0199237 A1* 8/2010 Kim et al. ......................... 716/3
2010/0293517 A1* 11/2010 Graeve et al. ................... 716/51

* cited by examiner

The annotation is a selection of one or more signal/cycle pairs, which causes a behavior to be generated in the form:

a == 1 ##2 (a==0 && b == 1)

which means a == 1 is followed by (a == 0 && b == 1) in two cycles.

FIG. 13

GENERALIZING AND INFERRING BEHAVIORS OF A CIRCUIT DESIGN

CROSS REFERENCE TO RELATED APPLICATIONS

This invention claims the benefit of U.S. Provisional Application No. 61/185,548, filed on Jun. 9, 2009, which is incorporated by reference in its entirety.

BACKGROUND

This invention relates generally to electronic design automation for circuit designs, and more particularly to using user input from waveforms to capture and index the behaviors of a circuit design.

With the increasing size and complexity of electronic circuits, design quality and productivity are becoming even more difficult to achieve. This is complicated by a number of factors. For example, circuit designs are built incrementally, but there is no practical method for verifying design changes incrementally. During the design process, even relatively insignificant changes to a circuit design may cause unintended side-effects. Due to the complexity of typical designs, the cost of uncovering a design bug increases non-linearly down the design flow.

Existing solutions for RTL designers include, for example, directed testing and formal assertion based verification. Directed testing is not within the typical designer's area of expertise, so the effort is non-trivial, even to achieve just a little verification coverage. Moreover, there is no persistent return-on-investment because the directed testing effort is usually thrown away. The other option, formal assertion based verification, is difficult to deploy because most designers lack knowledge of assertions.

Circuit designers have attempted to make their circuit designs more understandable in a number of ways. For example, when creating the executable description of a circuit design, designers sometimes place textual comments within the executable description of the circuit design, or they write a textual specification to go along with the circuit design. These techniques suffer from the severe limitation of being static. The designer must rely on the original writer to capture and maintain the textual description, and its accuracy depends on whether the writer has understood the executable description correctly and whether the static textual description was modified accordingly when the executable description is modified. If the original writer did not capture the exact aspect that the user is interested in, the user has no way to figure out whether the things he or she would like to do with the executable description can be done at all, and if so, how it can be done.

Since the specification can easily go out of date with the latest version of the design, the communication on design behaviors is typically supplemented by information received through hallway conversation, email, white-board discussion. These ad hoc methods of understanding a circuit design are clearly not efficient or reliable. Accordingly, there exists a need for improved tools to help circuit designs understand and work with the complex circuit designs that exist today.

SUMMARY

To improve the quality of circuit designs and enhance the productivity of circuit designers, embodiments of the invention provide mechanisms for tagging, indexing, and querying behaviors of a circuit design. In one embodiment, a number of waveforms are generated for a circuit design and then displayed to a designer. The designer specifies certain behaviors manifested in the waveforms that the designer believes might be interesting. These behaviors can be generalized to create new behaviors. These behaviors can also be used to infer new behaviors. The designer may also provide additional information about the behaviors, such as a textual description about the behavior. Each of the new behaviors is then stored in a data store and associated with an executable definition of the behavior, along with other information about the behavior such as its textual description. This process may be repeated for a number of different waveforms to generate a rich set of behaviors for the circuit design.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Behavioral Indexing

Behavioral indexing is a technique that allows a designer to maintain an indexed behavior database, track changes in behaviors as the executable description of the circuit design evolves, and figure out how the executable description can be reused in different projects. When applied to digital design development, behavioral indexing facilities the current design and verification effort, as well as design reuse down the line. During behavioral indexing, key circuit behaviors may be identified and captured in a machine-useable form that can be applied to the executable description with precise mathematical analysis to draw conclusion about how the executable description works.

As used herein, the term "behavior" refers to the actions and reactions of an executable description, usually in relation to the environment, the architectural specification, or the micro-architectural specification, and sometime to the implementation details as well. It may also be referred to the actions and reaction of the environment of the executable description. A behavior can be described by an executable expression that captures a temporal relationship of the states and events in the executable description, which can be stored in a database for referring the behavior at a later time. For example, a simple behavior may be captured as a Boolean expression, stating the relationship of signals at the same time step. In addition, for temporal relationship with multiple time steps, the sequence operators in two standard languages in the industry, PSL and SVA, can be used to capture a behavior in an executable specification. These two languages were developed to enable specification of Assumptions, Assertions, Coverage Points for assertion-based verification. In these languages, functional coverage points are also used in functional coverage measurements, typically defined as the determination of how much functionality of the design has been exercised by the verification environment. Instead of performing assertion-based verification and coverage measurements, one embodiment of behavior indexing can reuse these languages to capture behaviors as executable expressions.

Figure 1:
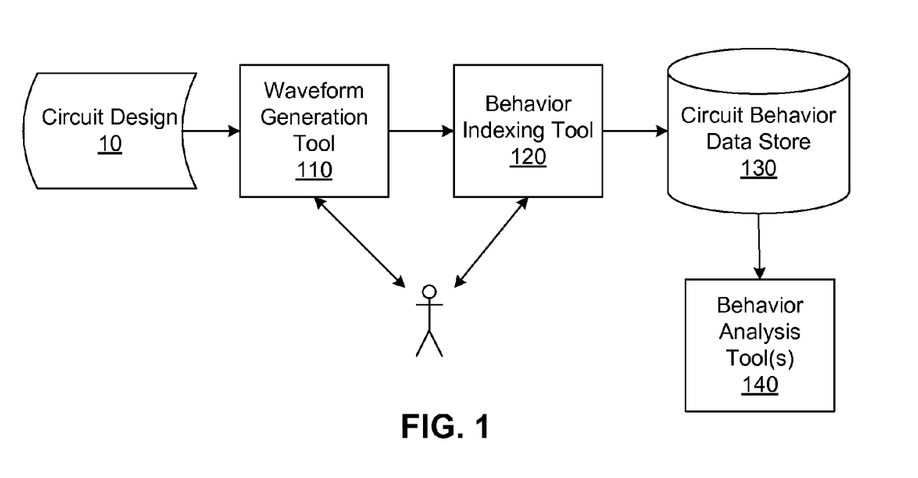
FIG. 1 is a diagram of a system for indexing behaviors of a circuit design and using the indexed behaviors to for analysis of the circuit design, in accordance with an embodiment of the invention.
Figure 2:
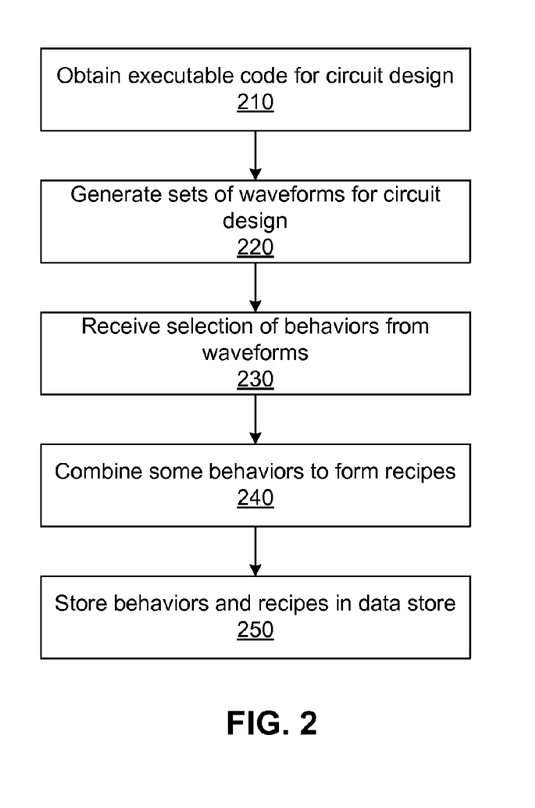
FIG. 2 is a flow diagram of a method for indexing behaviors of a circuit design, in accordance with an embodiment of the invention.

FIG. 1 illustrates one embodiment of a system for indexing behaviors of a circuit design, and FIG. 2 illustrate one embodiment of a process for indexing behaviors of a circuit design using the system of FIG. 1. The process is performed for a particular circuit design 10. The circuit design 10 may exist as a machine-executable description, such as circuit digital design model, register-transfer-level (RTL) digital design model, a system-level design model, or any other appropriate model for describing a circuit design.

The waveform generation tool 110 obtains 210 the circuit design 10, which comprises executable code for the design. The waveform generation tool 110 uses this executable code to generate 220 sets of waveforms for the circuit design, which are displayed to the circuit designer. The designer may interact with the waveform generation tool 110 to specify the waveforms to be generated according to any of a variety of means. In one embodiment, to generate the desired waveforms, the designer may specify features that the designer would like to see in the waveform.

Figure 3:
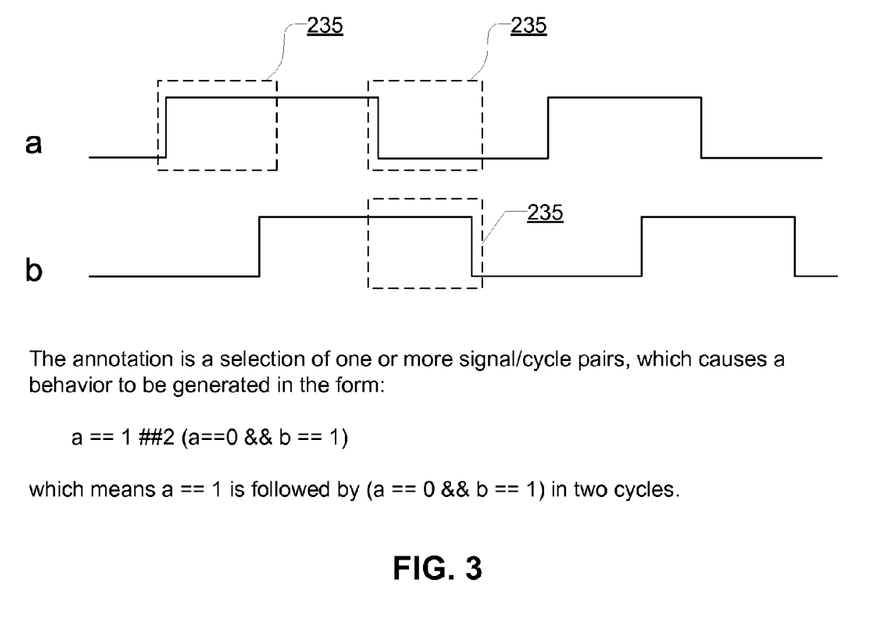
FIG. 3 shows an example of a displayed waveform and the selection of a behavior expressed therein.

When the waveform is displayed to a designer, the designer can select behaviors that are displayed in the waveform. If the designer finds the behavior to be meaningful, for example, the designer tags and/or labels the behavior by selecting it, and the behavior indexing tool 120 receives 230 the designer's selection. In one embodiment, the selection may be made via a graphical user interface, as illustrated in the example of FIG. 3. A waveform or a trace typically contains the sequences of values for the variables in the executable description. The designer selects the desired signal/cycle pairs 235 in the waveform, and the system converts the selection into an executable sequence. One embodiment of the invention captures "positive behavior," capturing sequences that are known to be exercisable, with the current trace as the witness of this fact. Another embodiment of the invention captures "negative behavior," which includes a sequence editor to take the existing sequence from the waveform selection, and receives an edit from the user to capture a revised sequence to guide future waveform generation.

A behavior may be defined as an elastic, temporal relationship amongst states. The behavior may be captured in many levels of granularity, such as nested, overlapping, among others. For a typical circuit design, the designer may specify hundreds of intended behaviors, where there might be thousands of functional coverage points for simulation. In a typical use, a behavior may be first observed in a specific version and configuration of a design, under specific environment assumptions. By defining the behavior "elastically," the designer may often be oblivious of the exact timing and activities, since an elastic behavior represents an abstraction on a design's functionality as something the design does over time. For example, the behavior captured with the selection in the waveform shown in FIG. 3 can be made "elastic" by converting the definition to have value 1 for unspecified but finite number of cycles (instead of a fixed value of 2) before getting value 0 for a and value 1 for b.

Once the user specifies one or more behaviors from one or more waveforms, the behavioral indexing tool 120 stores the behaviors in a circuit behavior data store 130. The exact format for the machine-usable behavior may depend on the languages of the executable description. For RTL design model, for example, PSL sequences, SVA sequences, or simple Boolean predicates may be used to capture behaviors. The stored behaviors that have been captured, tagged, and labeled by the designer may then be used by one or more behavior analysis tools 140, which may be configured to query the circuit behavior data store 130 and perform various types of analyses about the circuit design for a designer. A number of such behavior analysis tools 140 are described herein, although it can be appreciated that the indexed behaviors may be used in many other ways.

The set of behaviors indexed in the behavior data store 130 form a vocabulary by which humans can express queries of design functionality. In some embodiments of the invention, more complex "recipes" are created by combining 240 multiple behaviors and adding options on waveform related configurations. A typical recipe is a collection of at least one behavior, and optionally includes a configuration. Example configurations include the cycle interval in which each behavior should occur, a minimum length of the overall waveform, and a maximum length of the overall waveform, among many others. The waveform generation process takes the collection of behaviors and generates a waveform that exhibits each behavior at least once, and if the optional cycle interval is specified, with the occurrence within the specified interval. One embodiment of the invention picks a subset of behaviors at random to create new recipe. Another embodiment picks a subset of behaviors based on the degree of overlap in their cone-of-influence within the executable description. Yet another embodiment receives instruction from the user on which subset of behaviors to use to form a new recipe. The generated recipes are also added to the circuit behavior data store 130.

The waveform generation and display, the behavior selection, and the recipe generation processes are typically repeated multiple times. The end result is to populate the behavior data store 130 with a rich pool of behaviors and recipes that describe the circuit design.

As recipes and behaviors are specified and captured into the behavior data store 130, the designer may specify textual descriptions for the recipes and behaviors. For example, the designer may provide a textual comment about the behavior or recipe that describes why the designer believes the behavior or recipe to be meaningful for the circuit design. The resulting data store 130 thus contains links among the recipes, behaviors, textual descriptions.

Figure 4:
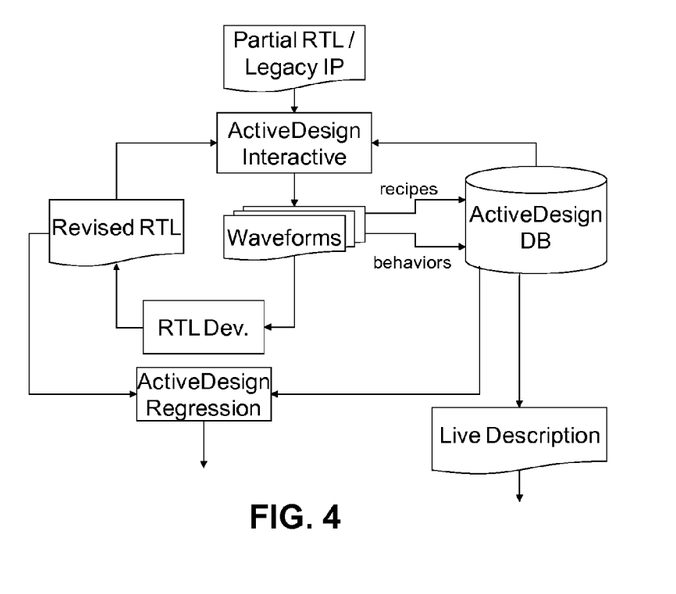
FIG. 4 is a diagram of a system for indexing behaviors of a circuit design, in accordance with an embodiment of the invention.

FIG. 4 illustrates one embodiment of the invention. As shown, starting with an executable description such as an RTL design, the embodiment generates waveforms out of very simple "recipes" received from the user. The embodiment stores the recipes used to generate the waveforms into a database, and receives "waveform highlights" from the user, and store them as "behaviors" into the database. Based on the current set of recipes and behaviors in the database, the embodiment then composes other recipes, either automatically or based on user-guidance, and creates more waveforms.

The initial recipes can be any of the following items, but not limited to the following items: (1) a specific line in the executable description to be illustrated; (2) a behavior captured as a Boolean expression referring to the variables in the executable description, such as "a+b", where the resulting waveform shows this expression to have value 1 in some time step; (3) a behavior captured as a temporal sequence referring to the variables in the executable description, such as "a ##1 b", where the resulting waveform shows "a" to have value 1 in some time step and "b" to have value 1 in the time step immediately after; (4) a behavior captured as a Boolean expression, but with a specific restriction on the time interval the expression must be 1; or (5) a behavior captured as a temporal sequence, but with a specific restriction on the time interval the sequence must be observed.

Given a recipe, a static analysis of the executable description is used to generate a waveform with all targets in the recipe satisfied in the waveform. U.S. Pat. No. 7,421,668, which is incorporated by reference in its entirety, describes other configurations that can be used to specify a waveform to be displayed to a designer.

Figure 5:
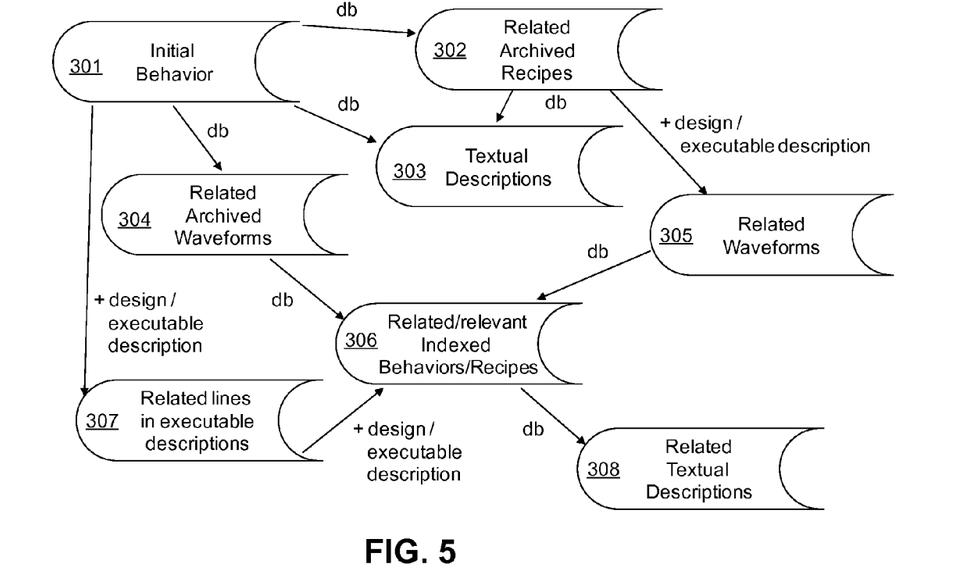
FIG. 5 illustrates the circuit behavior data store, in accordance with an embodiment of the invention.

FIG. 5 illustrates one embodiment of the circuit behavior data store 130. As illustrated, the data store 130 links each behavior 301 to its executable form and to its textual description 303. Recipes 302 in the database related to a behavior may be extracted by checking whether a recipe uses the behavior. Archived waveforms 304 (also captured in the data store 130) and waveforms 305 (generated from recipes in the data store 130) related to a behavior can be extracted by checking whether the sequence described in this behavior happens in the waveform. Recipes 306 used to generate the related waveforms and Behaviors 306 that happens in the related waveforms are therefore relevant to the behavior. While embodiments of the invention call a behavior that happens in a waveform to be "related" to the waveform, they also further classify a behavior to be "relevant" to the recipe used to generate the waveform if the items in the recipe are relevantly determined by the activities captured in the behavior, as disclosed in U.S. Pat. No. 7,137,078 and U.S. Pat. No. 7,437,694, each of which is incorporated by reference in its entirety. And related behaviors 306 extracted through the relevant waveforms lead to a set of related textual description 308, one for each related behaviors.

In one embodiment, the data store 130 uses cone-of-influence traversal of the executable description of the circuit design. From a particular behavior 301, using the executable sequence for the behavior, the cone-of-influence traversal of the executable description can be used to highlight the lines of executable descriptions 307 that are affecting this behavior. If a specific line of executable description is also in the cone-of-influence of another behavior, the data store 130 links it to the related behaviors 306.

In one embodiment, the relevant logic can be extracted for each waveform. If a specific line of executable description is in the relevant logic area of a waveform generated from a recipe, the invention links it to the related waveform and recipe. U.S. Pat. No. 7,137,078, which is incorporated by reference in its entirety, describes how the lines of an executable description relevant to a signal/cycle pair in a waveform can be extracted. The relevant logic can be extracted by performing this operation recursively. Once the relevant logic area of a waveform is generated, embodiments of the invention use techniques disclosed in U.S. Pat. No. 7,473,694, which is incorporated by reference in its entirety, to identify signals that are relevantly determined by this said relevant logic area of a waveform. From these relevantly determined signals and their activities, relevant behaviors are extracted from the data store.

This resulting data store 130 can be applied to different revision of the executable description to generate the waveforms specific to the revision of the description being used. The data store 130 can also be used for regression purposes, generating a waveform for each available recipe and reporting the differences when comparing to the previous revision of the design. The data store 130 can also be used for documentation purpose, supplementing or replacing static documents or descriptions of the circuit design.

In use, the data store 130 can be created by one person (e.g., a person dedicated to creating the behavioral index) while enabling many clients or other designers can use the behavioral index. The waveform used to specify a new behavior need not be generated from a recipe, as described above. Instead, the waveform may be obtained from a variety of sources, such as a waveform editor, in which a user draws the waveform. The waveform may also be obtained form a waveform library, from a simulation of the design, or from any other suitable source. Moreover, the recipe used for waveform generation need not be obtained from a signal or from composing a set of behaviors. Alternatively, the recipe may be obtained by taking an assertion, an assumption, or a requirement about the executable description of the circuit design, or from a recipe editor or library. If the waveform generation tool 110 is not able to find a legal waveform according to the recipe, this fact may also be important to be captured, since it may be important for enabling a "what-if analysis" on the executable description of the circuit design.

Behavior and Property Acquisition

Embodiments of the invention facilitate the capture of behaviors to be stored in the circuit behavior data store 130 and used by one or more of the behavior analysis tools 140. Embodiments of the invention also enable the capture of assumptions, assertions, and functional coverage points from waveforms.

Figure 6:
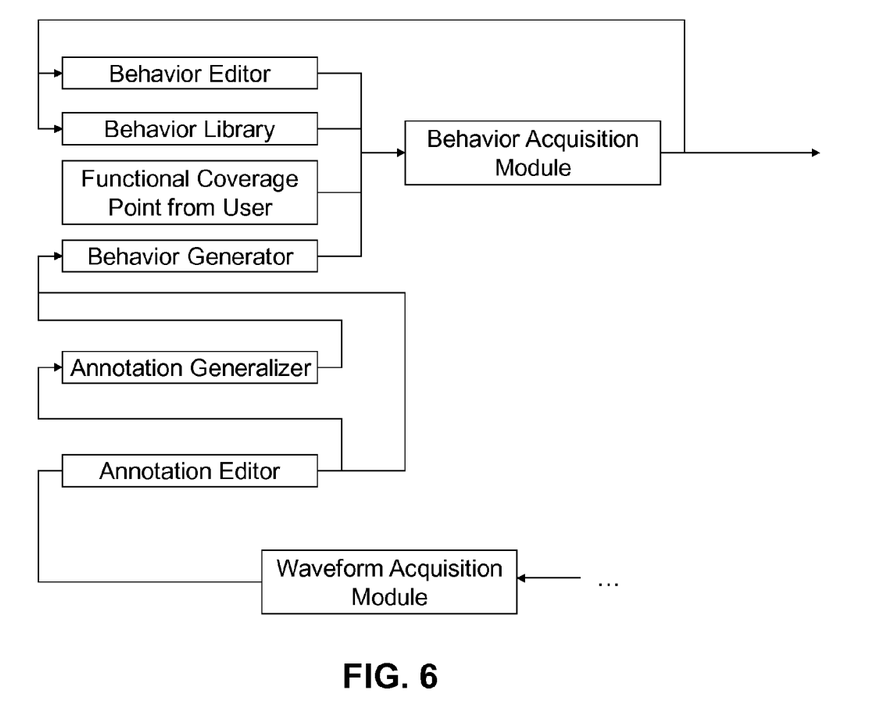
FIG. 6 shows various mechanisms by which a behavior can be acquired, in accordance with embodiments of the invention.

FIG. 6 shows various mechanisms by which a behavior can be acquired, including from the behavior data store, from a behavior editor, and also by converting functional coverage point into behavior. Furthermore, as described previously in connection with FIG. 3, behaviors can be generated from selections on a waveform. In addition to the basic selection mechanisms shown in FIG. 3, more complex "behavior acquisition annotations" can be received and processed to allow more general behavior description.

A waveform may represent positive behavior and/or negative behavior for a circuit design for a circuit design under various operating conditions. But because waveforms illustrate just one example of the behavior of a circuit design, one embodiment of the invention allow the waveform to be annotated with extra information to express a range of behaviors. These behavior acquisition annotations can be generalized further to broaden the scope of behavior to be "elastic". From these generalized annotations are created a useful set of behaviors, which apply to more than just the specific circuit behavior illustrated in the initial waveform. In other embodiments, these annotations can also be used to generate assumptions, assertions, and coverage points for use in formal verification, simulation, etc.

In one embodiment, a waveform acquisition module receives a waveform, which may be imported or created by the user. The waveform may be annotated using a behavior acquisition annotation editor, where one or more annotations are added. Several types of annotations may be applied, including annotations that define a relationship between two events within the waveform. Events in a waveform may include the edges of a signal (including the change in value of a word, or multi-bit data signal), a condition that evaluates the value of one or more signals, or other event that describes the state of the waveform. Once added, the annotations are generalized, preferably so that each annotation defines only the minimally necessary information in which the requirement is desired to apply. In this way, the annotation applies to the broadest possible set of operating conditions, and the resulting behavior will not be unduly narrow. Additional annotations can be also be inferred from the existing set of annotations to capture different aspects of the behavior that the user may not have explicitly captured in the original set of annotations. Once the annotations have been generalized, a behavior generator converts the generalized annotations into one or more behaviors, which accurately reflect the intent of the designer as expressed in the waveform, the annotations, and ultimately the generalization.

In this way, a user may use waveforms to specify behaviors graphically rather than having to write them manually. This allows users to create effective behaviors for complex circuit designs. Moreover, the solution integrates the visual feedback that waveforms provide with the behavior generation process, thus improving the designer's ability to create behaviors that accurately reflect the intent behind the circuit design.

A variety of types of behavior acquisition annotations may be available to allow the designer to express behaviors. Different types of annotations give the designer more flexibility in specifying aspects of the waveform activities that will eventually lead to the generation of versatile behaviors. In one embodiment, each annotation may fall within a specific class of annotations, including: causality arrows, stability annotations, tag annotations, local and global annotations, and unfolding annotations. Specific examples of annotations in each of these classes are described in more detail below for instructional purposes. As these types of annotations are merely tools for specifying the behavior of a waveform, it will be appreciated that other types of annotations may be defined for specifying other types of behavior. Therefore, other embodiments of the invention may allow for different types of annotations not specifically described herein.

One class of annotations includes causality arrows. In one embodiment, a causality arrow type annotation includes a triggering event (i.e., the beginning of the arrow); a triggered event (the end of the arrow); an optional guard that specifies when the relationship between the two events applies; and a time interval that specifies a time lag between the two events. The triggering and triggered events may be any aspect shown in the waveform that is capable of appearing in a behavior, such as the rising or falling edge of a signal or a value of a signal at any given time shown in the waveform. A triggering event is typically an edge event, and a triggered event can be an edge event or a value event. The time interval may be a constant delay (including 0), a range bounded by constants (e.g., [1:4]), an unbounded range (e.g., [1:$], where $ represents infinity), a delay specified by an expression (e.g. [a–b]), or an interval specified by an expression (e.g., [a–b:a+b]).

Figure 7:
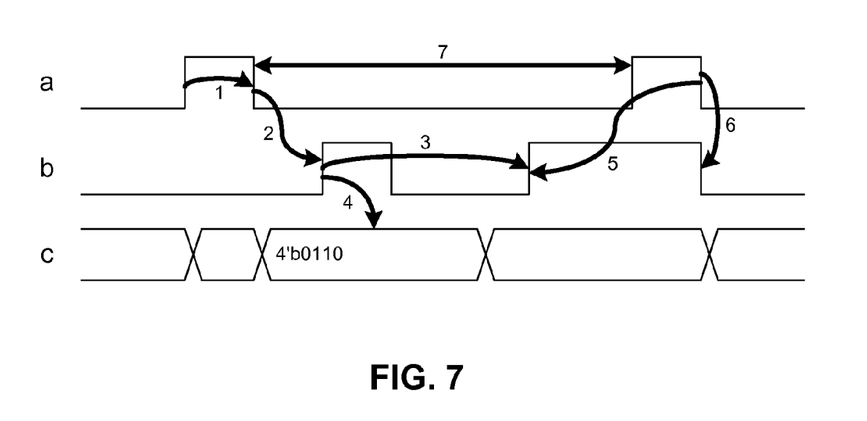
FIG. 7 illustrates an example waveform, according to one embodiment of the invention.

FIG. 7 illustrates an example waveform that includes signals a, b, and c, according to one embodiment of the invention. This waveform is annotated with causality arrows, having a set of annotations labeled 1 through 7 overlaid on the waveform. In the convention used in the drawing, the annotation is depicted as an arrow drawn over the waveform, pointing from the triggering event to the triggered event. Taking annotation 1, for example, the triggering event is the first shown rising edge of signal a, and the triggered event is the immediately following falling edge of signal a. Alternatively, the triggering and/or triggered events may be a condition of a signal at a given time—e.g., where the condition an expression that evaluates the value of the signal during the specified time period. For example, annotation 4 points to the value of data signal c, so the triggered event of that annotation may be a function or expression of the condition of signal c at the time shown. The signal may be a single bit (i.e., resolving to a 1 or j), or it may be n bits. The triggering and triggered events need not be on the same signal, as for annotations 2, 4, and 5.

A causality arrow type annotation thus imports some type of causality relationship between two events in a waveform that exists when certain conditions are met. As a number of types of causality relationships are possible, a causality arrow may further be categorized into a number of subtypes based on its logical effect. Example subtypes include, but are not limited to, the following types or causality arrows, with the logical effect of each type of causality arrow explained:

a) Leads to: For a "leads to"-type annotation, if the triggering event occurs, the triggered event must occur after the triggering event. Effectively, this creates an implication relationship, which can be described by an "if . . . then" statement. It is noted that the annotation has effect only if the triggering event occurs, since it is not necessary that the triggering event to have occurred if the triggered event occurs. Causality arrows 1 through 4 and 6 in FIG. 7, for example, could be of this type.

b) Precedence: For a "precedence"-type annotation, if the triggered event occurs, the triggering event must have occurred beforehand. It is noted that if the triggering event occurs, the triggered event need not occur. Causality arrow 5, for example, could be of this type.

c) Simultaneous: For a "simultaneous"-type annotation, the triggering and triggered events must occur at the same time. Causality arrow 6, for example, could be of this type     d) Conflict: For a "conflict"-type annotation, the triggering and triggered events must occur at a different time. Causality arrows 1 through 5, for example, could be of this type.

Although the preceding types of causality arrows are described, it can be appreciated that the annotation editor can be configured to create other types of annotations that circuit designers might find desirable. The annotations and their effect are based on the logical means by which a designer can graphically define a set of behaviors. Accordingly, adding other types of annotations to allow for other types of definitions is well within the skill in the art.

In another embodiment, an annotation may be a stability annotation, such as annotation 7 in FIG. 7. A stability annotation is a different kind of annotation than the causality arrows described above. A stability annotation specifies that a signal must remain at 0, 1, or any value N (where N can be a constant or a variable, a single bit or multiple bits) for a given amount of time. The time of the stability can be defined in terms of absolute time starting from one event (e.g., a given number of clock cycles since the rising edge of signal a) or in terms of relative time between two events (e.g., between the rising and falling edges of signal a). The stability annotation type annotation thus gives the designer yet another tool to specify graphically the criteria for the desired behavior.

Figure 8:
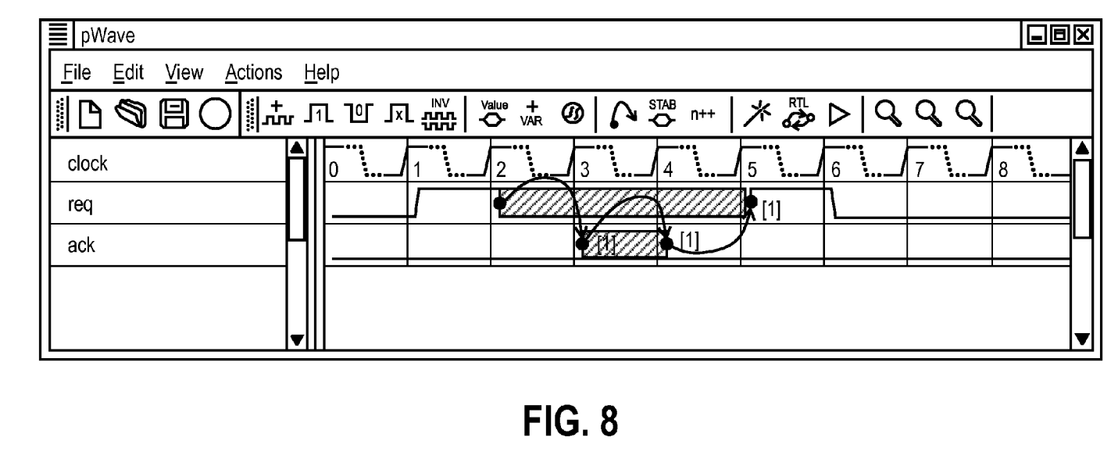
FIG. 8 shows a screen shot illustrating a stability annotation added to a waveform, in accordance with an embodiment of the invention.

FIG. 8 shows a screen shot illustrating a stability annotation added to a waveform, in accordance with an embodiment of the invention. Shown in this example are a request signal (req) and an acknowledge signal (ack). Based on the causality arrows added to the waveform in this example, the tool may infer two stability annotations. One stability annotation is shown as a shaded region for the req signal, and the other as a shaded region for the ack signal.

Figure 9:
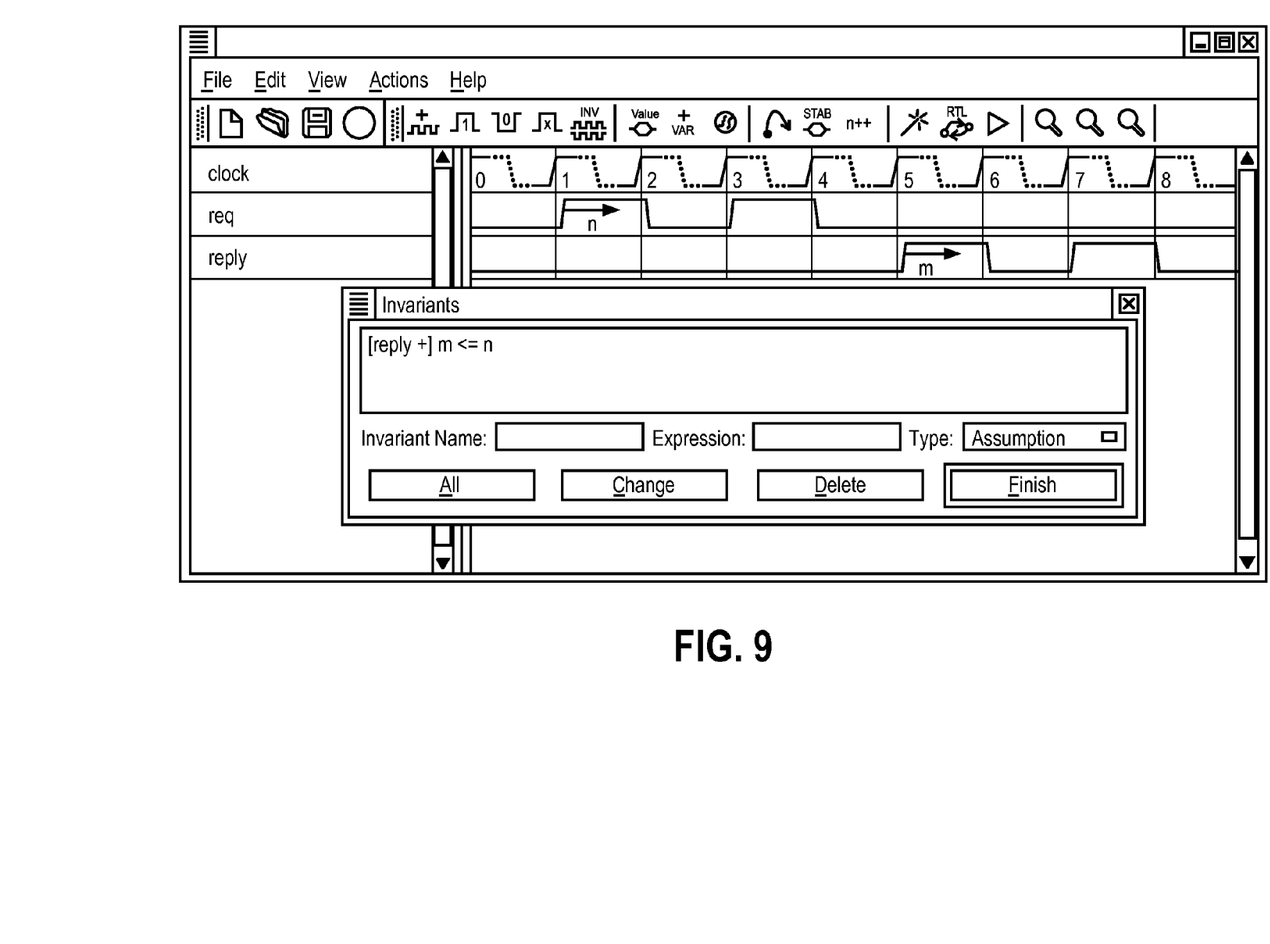
FIG. 9 shows a screen shot illustrating a counting annotation added to a waveform, in accordance with an embodiment of the invention.

A counting annotation describes a relationship that involves the number of occurrences of one or more events in the waveform. FIG. 9 shows a screen shot illustrating a counting annotation added to a waveform, in accordance with an embodiment of the invention. In this example, the waveform includes a request signal (req) and reply signal (reply). To implements the counting annotation, a counter n is created to count the number of times the signal req is asserted, and a counter m is created to count the number of times the signal reply is asserted. The annotation is then defined by the expression written in the pop-up dialog in FIG. 9 (i.e., "[reply+] m<=n"). As this expression is written, the rising edge of reply (reply+) is associated with the property m<=n. In other words, this expression mandates that whenever reply is asserted, the value of the counter m (the number of times reply is asserted) is less than or equal to the value of the counter n (the number of times req is asserted).

Figure 10:
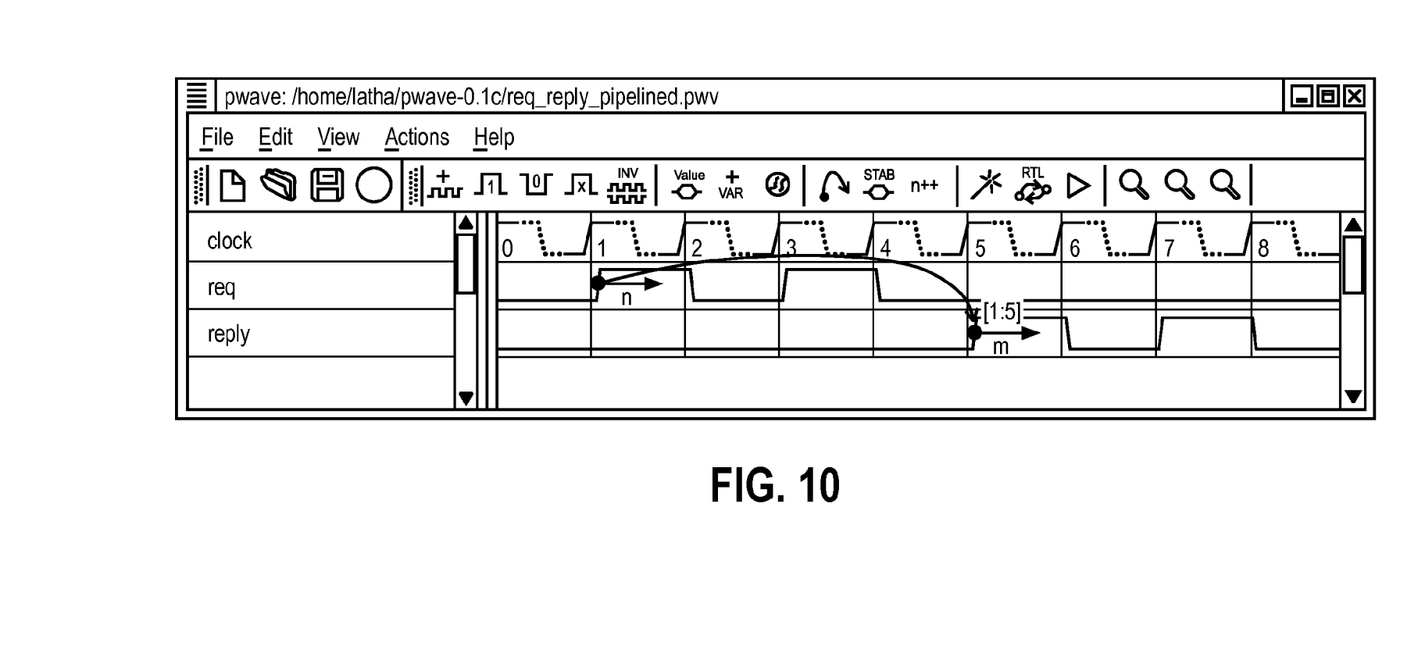
FIG. 10 is a screen shot illustrating an arrow tagging annotation resulting from a counting annotation and a causality arrow, in accordance with an embodiment of the invention.

An arrow tagging annotation is an annotation that can be inferred from counting annotations and causality arrows on a waveform. FIG. 10 is a screen shot illustrating an arrow tagging annotation resulting from a counting annotation and a causality arrow, in accordance with an embodiment of the invention. In this example, the waveform includes a request signal (req) and a reply signal (reply). Similar to the counting annotation example above, a counter n is created to count the number of times the signal req is asserted, and a counter m is created to count the number of times the signal reply is asserted. A causality arrow is added to constrain the waveform so that after the triggering event, the rising edge of req (req+), the triggered event, the rising edge of reply (reply+), occurs one to five clock cycles afterwards. The tool automatically detects that the triggering event of the causality arrow is tagged with counter n, and the triggered event is tagged with counter m. Accordingly, the tool applies the causality arrow to all occurrences of req+ and reply+ that have matching tags. This operation may be automatic or may require confirmation by the user.

Figure 11:
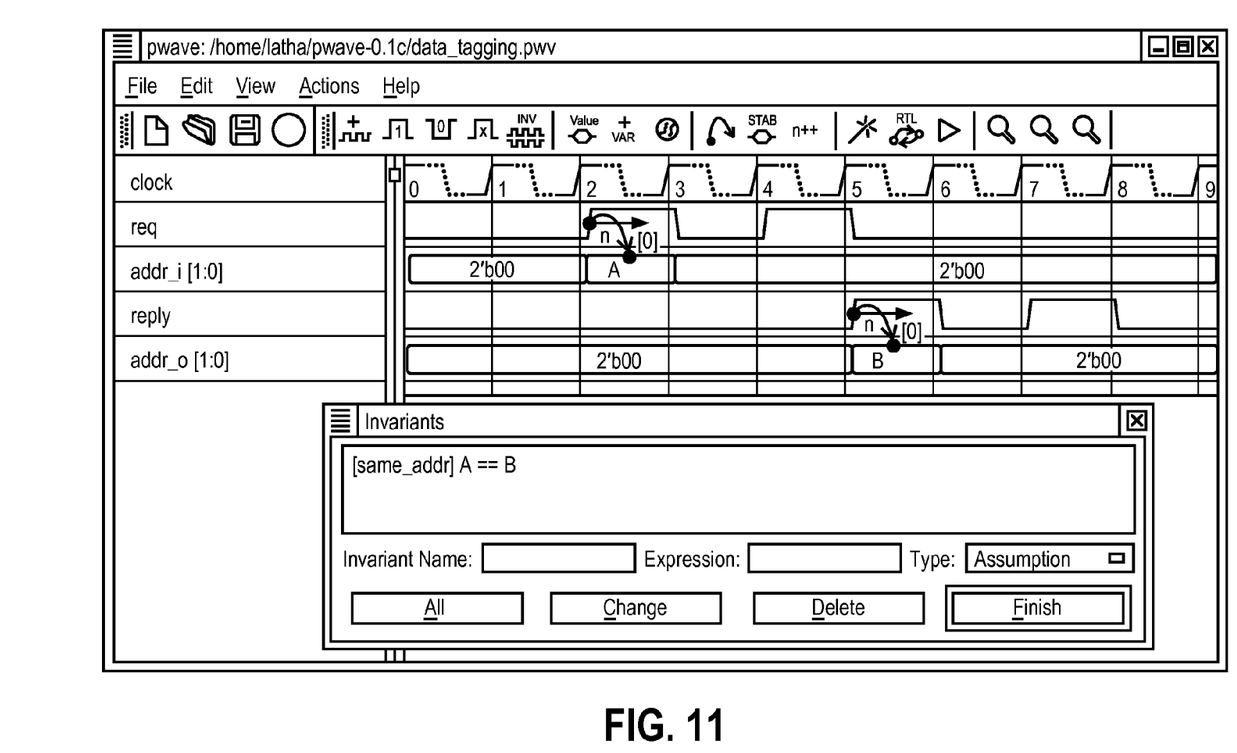
FIG. 11 is a screen shot illustrating a data tagging annotation being added to a waveform, in accordance with an embodiment of the invention.

A data tagging annotation is another type of annotation that can be inferred from counting annotations and causality arrows on a waveform. FIG. 11 is a screen shot illustrating a data tagging annotation being added to a waveform, in accordance with an embodiment of the invention. In this example, the waveform includes is a request signal (req) and a reply signal (reply). A counter n counts the number of times the req signal is asserted, while a counter m counts the number of times the reply signal is asserted. A causality arrow is added where the rising edge of req (req+) is the triggering event and the value of addr_i (A), a value event, is the triggered event. Another causality arrow is added from the rising edge of reply (reply+) to the value of addr_o (B). The tool automatically detects that triggering event reply+ for value event B is associated with counter m. The tool also detects that triggering event req+ for value event A is associated with counter n. The tool then generalizes the property A==B to all occurrences of value event A and B that have matching tags (or causality arrows). Using a pop-up dialog, the property, same_addr, is then added to state that A==B. In this way, the data tagging annotation required that the value of addr_i (A) is equal to the value of addr_o (B) at each matching pair of req+ and reply+.

The arrow tagging and data tagging annotations can be thought of as a general class of annotations called action annotations. Action annotations involve a triggering event and an action associated with the triggering event. For example, an arrow tagging annotation is an action annotation because it includes a triggering event and a counter. An arrow tagging annotation counts the number of occurrences of events similar to the triggering event and then tags each occurrence with a unique tag, often represented by an integer. Conceptually, the value of associated counter is assigned to an occurrence of the event, after which the counter is incremented. Accordingly, the next occurrence of the event will be tagged with a larger value. The value of the counter indicates how many similar events have occurred.

Figure 12:
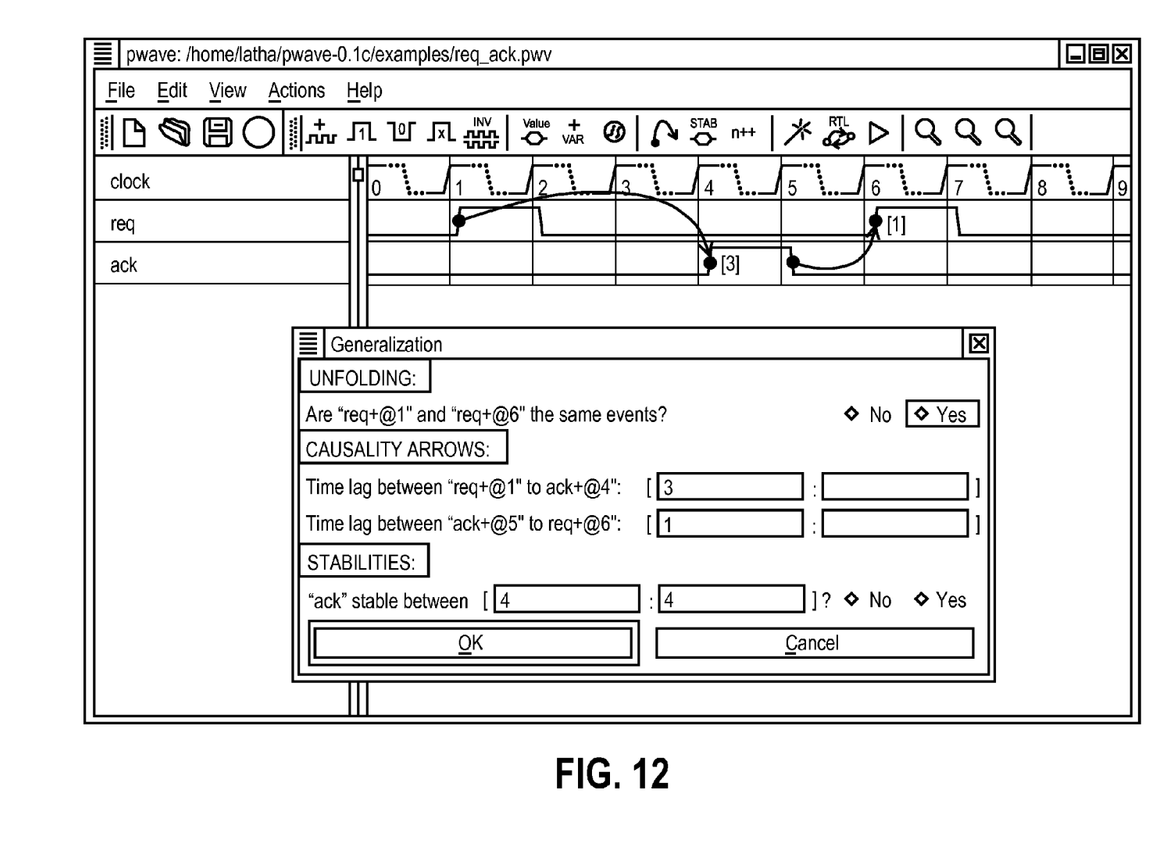
FIG. 12 is a screen shot illustrating how an unfolding annotation can be added to a waveform, in accordance with an embodiment of the invention.

Yet another class of annotations is unfolding annotations. An unfolding annotation contains two events that are to be considered the same event by unfolding the annotated waveform. This allows a user to define an unfolding point, which is a time when the waveform should repeat itself, which allow the user to specify the condition of repeating sequences. FIG. 12 is a screen shot illustrating how an unfolding annotation can be added to a waveform, in accordance with an embodiment of the invention. This example illustrates two events on the waveform that the user indicates are the same event (i.e., an earlier event is a repetition at a later cycle of the latter event): The rising edge of req at time 1 and the rising edge of req at time 6 are the same event.

In one embodiment, these annotations capture positive behaviors into the behavior data store. In other embodiments, in addition to specifying from among the various types of annotations, the annotation editor can specify the effect of the annotation, such as positive behavior, negative behavior, assumption, positive assertion, and negative assertion, depending on the target applications of the acquisition annotations.

In one embodiment, once the designer has finished editing the annotated waveform, an annotation generalizer attempts to generalize the annotations so they apply as broadly as possible. Causality arrow annotations can be generalized by changing the time interval and/or the optional guard. The time interval of a causality arrow defaults to the constant value shown in the waveform, but the user can adjust the time interval to any range as described above.

Figure 13:
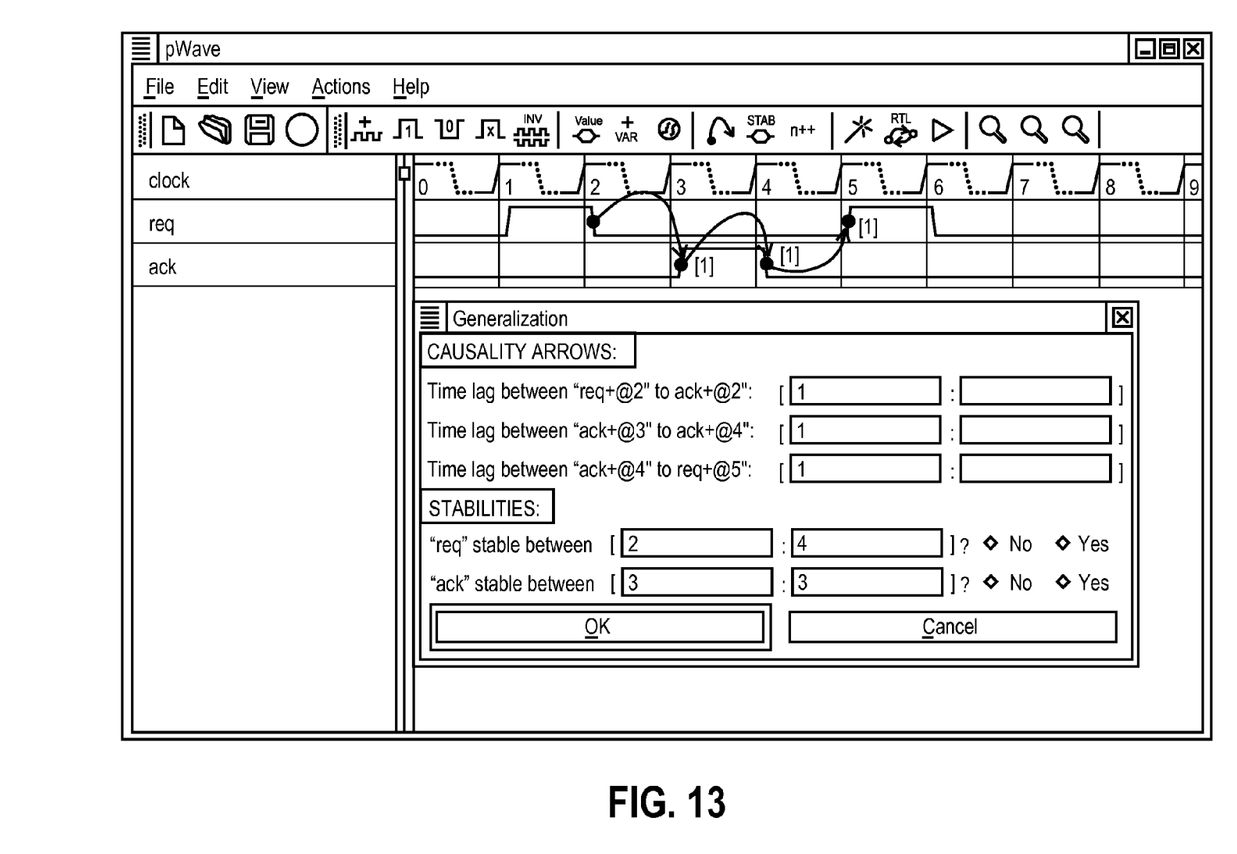
FIG. 13 is a screen shot of the generalization of a stability annotation, in accordance with one embodiment.

If the annotation is a stability annotation, other types of generalizations may apply. In one embodiment, for a stability annotation, the user is prompted to specify the time during which the signal is to remain at the value. The time may be a constant or a variable, (based, for example, on the value of another signal). The user may also be prompted to specify a condition of the signal that must be true during this time period. For a multiple bit signal, for example, that user may generalize the stability annotation so that it requires the signal to stay within a given range during the time period rather than stay exactly at the particular value. FIG. 13 is a screen shot of the generalization of a stability annotation, in accordance with one embodiment. Using the dialog in this user interface, a user can specify generalizations such as whether the value of each signal is stable and for how long it should be stable.

For example, the value of req is stable at 0 from clock cycle 2 to clock cycle 4, and the value of ack is stable at 1 for the third clock cycle.

Summary

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal may be embodied in a product, where the signal is presented in a tangible medium or carrier wave and modulated or otherwise encoded in the carrier wave, and transmitted according to any suitable transmission method. The computer data signal product may be produced or made according to any of the processes described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-program product comprising a non-transitory computer-readable storage medium storing computer-executable code for indexing behaviors of a circuit design, the code when executed by a computer processor causes the processor to perform steps comprising:
   receiving an executable description of the circuit design;
   generating a waveform for the circuit design using the executable description, the generated waveform showing one or more signals of the circuit design over a number of cycles;
   displaying the waveform;
   adding to the displayed waveform a first annotation of a first behavior of the circuit design illustrated in the waveform responsive to receiving a selection of the first annotation;
   generalizing the first annotation of the first behavior into a second annotation of a second behavior; and
   storing an executable expression of the second behavior in a data store indexed to a portion of the executable description associated with the second behavior.

2. The computer-program product of claim 1, wherein generalizing the first annotation comprises broadening the scope of the first annotation.

3. The computer-program product of claim 1, wherein generalizing the first annotation comprises adjusting a time interval of the first annotation.

4. The computer-program product of claim 1, wherein generalizing the first annotation comprises generalizing the first annotation responsive to a user input of the generalization.

5. The computer-program product of claim 1, wherein the code further causes the processor to perform steps of:
   receiving a textual description of the second behavior from a user; and
   storing the textual description in the data store in association with the second behavior.

6. The computer-program product of claim 1, wherein generating the waveform comprises generating the waveform from a simulation of the circuit design.

7. The computer-program product of claim 1, wherein generating the waveform comprises generating the waveform from a recipe.

8. The computer-program product of claim 7, wherein the recipe comprises at least one of the following: (1) a signal in the description, (2) a line in the description, (3) an assumption, (4) an assertion, and (5) a functional coverage point, and (6) an indexed behavior previously stored into the data store.

9. The computer-program product of claim 1, wherein the second annotation comprises one of the following: (1) a highlight of a signal edge transition, (2) a causality arrow linking a triggering event to a triggered event, (3) a stability annotation, (4) a counting annotation, (5) an arrow tagging annotation, (6) a data tagging annotation, and (7) an unfolding annotation.

10. The computer-program product of claim 1, wherein the second annotation is a causality arrow comprising at least one of: (1) a leads-to annotation, (2) a precedence annotation, (3) a simultaneous annotation, and (4) a conflict annotation.

11. The computer-program product of claim 1, wherein a behavior comprises actions and reactions of the executable description of the circuit design.

12. A computer-program product comprising a non-transitory computer-readable storage medium storing computer-executable code for indexing behaviors of a circuit design, the code when executed by a computer processor causes the processor to perform steps comprising:
   receiving an executable description of the circuit design;

generating a waveform for the circuit design using the executable description, the generated waveform showing one or more signals of the circuit design over a number of cycles;

displaying the waveform;

adding to the displayed waveform a plurality of annotations of behaviors of the circuit design illustrated in the waveform responsive to receiving a selection of the annotations;

inferring a new annotation of a new behavior from the plurality of annotations of the behaviors; and storing an executable expression of the new behavior in a data store indexed to a portion of the executable description associated with the new behavior.

13. The computer-program product of claim 12, wherein inferring a new annotation comprises automatically inferring a new annotation.

14. The computer-program product of claim 12, wherein the code further causes the processor to perform steps of:

receiving a textual description about the new behavior from a user; and storing the textual description in the data store in association with the new behavior.

15. The computer-program product of claim 12, wherein generating the waveform comprises generating the waveform from a simulation of the circuit design.

16. The computer-program product of claim 12, wherein generating the waveform comprises generating the waveform from a recipe.

17. The computer-program product of claim 16, wherein the recipe comprises at least one of the following: (1) a signal in the description, (2) a line in the description, (3) an assumption, (4) an assertion, and (5) a functional coverage point, and (6) an indexed behavior previously stored into the data store.

18. The computer-program product of claim 12, wherein the new annotation comprises at least one of the following: (1) a stability annotation, (2) an arrow tagging annotation, or (3) a data tagging annotation.

19. A computer-implemented method for indexing behaviors of a circuit design, the method comprising:

receiving an executable description of the circuit design;

generating a waveform for the circuit design using the executable description, the generated waveform showing one or more signals of the circuit design over a number of cycles;

displaying the waveform;

adding to the displayed waveform a first annotation of a first behavior of the circuit design illustrated in the waveform responsive to receiving a selection of the first annotation;

generalizing, by a computer, the first annotation into a second annotation of a second behavior; and storing an executable expression of the second behavior in a data store indexed to a portion of the executable description associated with the second behavior.

20. A computer-implemented method for indexing behaviors of a circuit design, the method comprising:

receiving an executable description of the circuit design;

generating a waveform for the circuit design using the executable description, the generated waveform showing one or more signals of the circuit design over a number of cycles;

displaying the waveform;

adding to the displayed waveform a plurality of annotations of behaviors of the circuit design illustrated in the waveform responsive to receiving a selection of the annotations;

inferring, by a computer, a new annotation of a new behavior from the plurality of annotations of the behaviors; and storing an executable expression of the new behavior in a data store indexed to a portion of the executable description associated with the new behavior.

* * * * *